United States Patent [19]

Bauer et al.

[11] Patent Number: 4,965,738
[45] Date of Patent: Oct. 23, 1990

[54] INTELLIGENT BATTERY SYSTEM

[75] Inventors: George W. Bauer, Windermere, Fla.; Thomas J. Sokira, Cheshire, Conn.

[73] Assignee: Anton/Bauer, Inc., Shelton, Conn.

[21] Appl. No.: 189,958

[22] Filed: May 3, 1988

[51] Int. Cl.$^5$ .................. G01R 19/00; H02J 7/04
[52] U.S. Cl. .................. 364/483; 320/39; 320/48; 340/636; 364/550
[58] Field of Search .................. 364/480–483, 364/707, 550; 320/5, 39, 48, 31; 340/636; 324/424

[56] References Cited

U.S. PATENT DOCUMENTS

| | | | |
|---|---|---|---|
| 3,864,617 | 2/1975 | Smith et al. | 320/23 |
| 3,867,681 | 2/1975 | Bishop et al. | 320/21 |
| 3,911,350 | 10/1975 | Swope | 320/22 |
| 3,917,990 | 11/1975 | Sherman, Jr. | 320/35 |
| 3,938,019 | 2/1976 | Schmitt et al. | 320/21 |
| 3,944,904 | 3/1976 | Hase | 320/23 |
| 3,959,707 | 5/1976 | Stephens | 320/39 |
| 3,963,976 | 6/1976 | Clark | 320/21 |
| 3,987,353 | 10/1976 | Macharg | 320/39 |
| 4,006,397 | 2/1977 | Catotti et al. | 320/31 |
| 4,016,473 | 4/1977 | Newman | 320/14 |
| 4,031,450 | 6/1977 | Hammel et al. | 320/23 |
| 4,035,709 | 7/1977 | Seider et al. | 320/23 |
| 4,061,956 | 12/1977 | Brown et al. | 320/22 |
| 4,087,733 | 5/1978 | Casagrande | 320/21 |
| 4,097,792 | 6/1978 | Calaway | 320/22 |
| 4,125,802 | 11/1978 | Godard | 320/35 |
| 4,136,310 | 1/1979 | Foster | 320/37 |
| 4,194,146 | 3/1980 | Patry et al. | 320/44 |
| 4,203,103 | 5/1980 | Osada et al. | 340/636 |
| 4,217,645 | 8/1980 | Barry et al. | 364/483 |
| 4,237,411 | 12/1980 | Koethe et al. | 320/21 |
| 4,270,080 | 5/1981 | Kostecki | 320/24 |
| 4,289,836 | 9/1981 | Lemelson | 429/61 |
| 4,297,630 | 10/1981 | Mullersman | 320/35 |
| 4,301,398 | 11/1981 | Johnson | 320/21 |
| 4,302,714 | 11/1981 | Yefsky | 320/39 |
| 4,308,492 | 12/1981 | Mori et al. | 320/39 |
| 4,313,078 | 1/1982 | Bilsky et al. | 320/15 |
| 4,316,185 | 2/1982 | Watrous et al. | 340/636 |
| 4,321,523 | 3/1982 | Hammel | 320/14 |
| 4,329,406 | 5/1982 | Dahl et al. | 320/48 |
| 4,352,067 | 9/1982 | Ottone | 324/424 |
| 4,355,275 | 10/1982 | Anglin | 320/21 |
| 4,377,787 | 3/1983 | Kikuokactal | 324/431 |
| 4,394,741 | 7/1983 | Lowndes | 364/483 |
| 4,455,523 | 6/1984 | Koenck | 320/39 |
| 4,553,081 | 11/1985 | Koenck | 320/39 |
| 4,554,500 | 11/1985 | Sokira | 320/31 |
| 4,558,281 | 12/1985 | Codd et al. | 320/48 |
| 4,649,373 | 3/1987 | Bland et al. | 364/707 |
| 4,698,748 | 10/1987 | Juzswik et al. | 364/707 |
| 4,709,202 | 11/1987 | Koenck et al. | 320/39 |
| 4,716,354 | 12/1987 | Hacker | 320/39 |
| 4,716,463 | 12/1987 | Stacy et al. | 364/707 |
| 4,737,702 | 4/1988 | Koenck | 320/5 |
| 4,747,041 | 5/1988 | Engel et al. | 364/707 |

OTHER PUBLICATIONS

"A52 Battery Pack Ah Counter Operation Principle'-'—AMPEX Corporation, date unknown.

Primary Examiner—Kevin J. Teska
Attorney, Agent, or Firm—Kramer, Brufsky & Cifelli

[57] ABSTRACT

An intelligent battery system senses current flowing in the direction of charge current through positive and negative terminals and battery cells of a battery pack. In response, a processor within the battery pack transmits battery parameter data to a separate output port of the battery pack. The battery parameter data includes the state of charge of the battery cells, temperature data and the type of battery pack. The processor also responds to specific data requests transmitted into the battery terminals by transmitting the requested battery parameter data. The battery pack is also designed to minimize power dissipation of the processor. When the battery pack is not subjected to either charge or discharge for a predetermined period, the processor is rendered into a "light-sleep" mode in which power dissipation is substantially reduced. The processor is awakened from the light-sleep either by a timer or by charge or discharge activity to monitor the amount of charge or discharge and other battery parameters.

18 Claims, 5 Drawing Sheets

INTELLIGENT BATTERY SYSTEM

BACKGROUND OF THE INVENTION

The invention relates generally to intelligent battery systems comprising a battery pack with electronic circuitry to monitor battery parameters, and an associated battery charger. The invention deals more particularly with apparatus and processes for minimizing power dissipation by the electronic circuitry, and providing two-way communication between the battery pack and the battery charger.

A previously known battery pack with a microprocessor was disclosed in U.S. Pat. No. 4,289,836 to Lemelson. The microprocessor monitors battery parameters such as the state of battery charge, number of charging cycles, battery temperature, and battery pressure. The microprocessor may also be used to control a display for the battery parameters. The battery pack is coupled to a simple power supply for recharging purposes.

Another previously known battery pack is disclosed in U.S. Pat. No. 4,553,081 to Koenck which battery pack includes a microprocessor secured to a battery housing. The microprocessor monitors battery operation to determine remaining battery capacity, and counts the number of shallow discharges and successive recharging cycles to estimate deterioration of the battery. Circuitry within the battery pack occasionally causes a discharge of the battery to determine present battery capacity. The microprocessor and other circuitry require little operating power so that the shelf-life of the battery pack is long. The microprocessor is also coupled to a display for indicating battery capacity and other information obtained from the battery.

The battery pack of U.S. Pat. No. 4,553,081 also includes several I/O ports to communicate with a portable computer terminal device and a battery charger.

A general object of the present invention is to provide a battery pack which includes electronic circuitry to monitor battery parameters, which electronic circuitry draws minimal average power.

Another general object of the present invention is to provide a battery pack of the foregoing type and an associated battery charger which can provide two-way communication between each other via a small number of interconnections.

A more specific object of the present invention is to provide a battery pack of the foregoing type which accurately monitors battery discharge and charge.

SUMMARY OF THE INVENTION

The invention resides in an intelligent battery system which monitors battery parameters such as the state of charge of the battery, the temperature of the battery cells and the type of battery. A battery pack within the system comprises positive and negative terminals serially coupled to the battery cells. The postive terminal is adapted to output load current and receive charging current.

According to one feature of the invention, pulses of data current are input to the positive terminal of the battery pack by a battery charger or other device, and the battery pack senses the current pulses. The battery pack includes a memory which stores battery parameter data, and a processor which transmits the battery data to an output port of the battery pack in response to the pulses of data current input through the positive terminal. Alternately, the processor means transmits the battery parameter data to the charger at the onset of the delivery of charging current.

In accordance with another feature of the invention, the processor means is rendered into a functional, relatively high power consumption mode, eiher by a timer or by sensing current flow, to determine the state of charge of the battery cells based on the amount of current flowing through the battery cells. The processor means is rendered into a non-functional, relatively low power consumption mode at other times to conserve power.

DETAILED DESCRIPTION OF THE PREFERRED EMBODIMENTS

Figure 1:
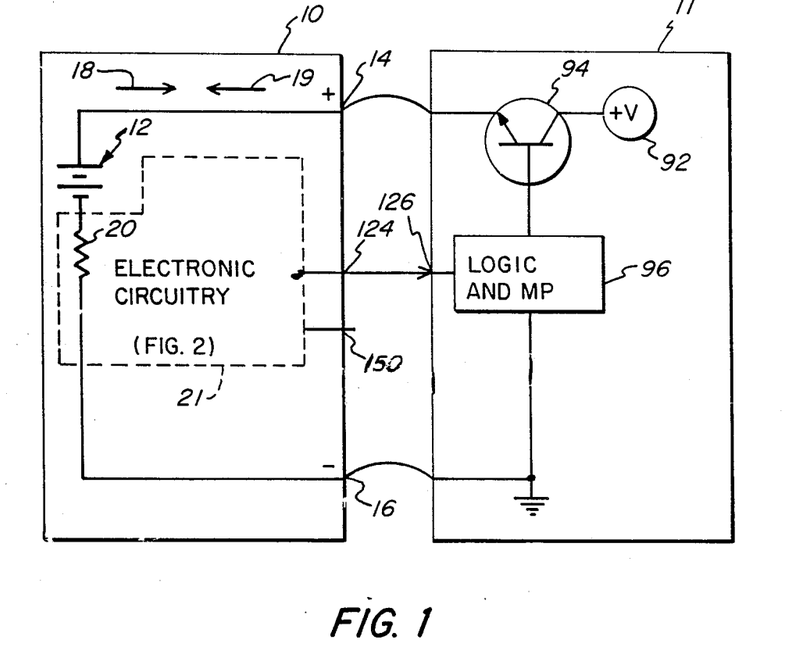
FIG. 1 is a simplified circuit diagram of a battery pack and an associated battery charger in accordance with the present invention.

Referring now to the figures in detail wherein like reference numerals indicate like elements throughout the several views, FIG. 1 illustrates a battery pack generally designated 10 and an associated battery charger 11 embodying the present invention in simplified schematic form. The battery pack includes a plurality of rechargeable battery cells 12 and, by way of example, there are ten to twelve such cells of the nickle cadmium type. Collectively, the battery cells may have a capacity of either two ampere-hours or four ampere-hours. The battery pack 10 further includes a positive terminal 14 and a negative or return terminal 16 to receive charging current from and return charging current to battery charger 11. The positive terminal 14 also can deliver current to a load (not shown).

When the battery cells 12 deliver current to the load, the current flows in the direction indicated by an arrow 18. Conversely, when the battery cells are charged, current flows in the direction indicated by an arrow 19. Either current develops a voltage across a resistor 20 which is connected in series with the battery terminals and cells. To minimize power dissipation in the resistor 20, the resistor is small, for example, 0.025 ohms.

Figure 2:
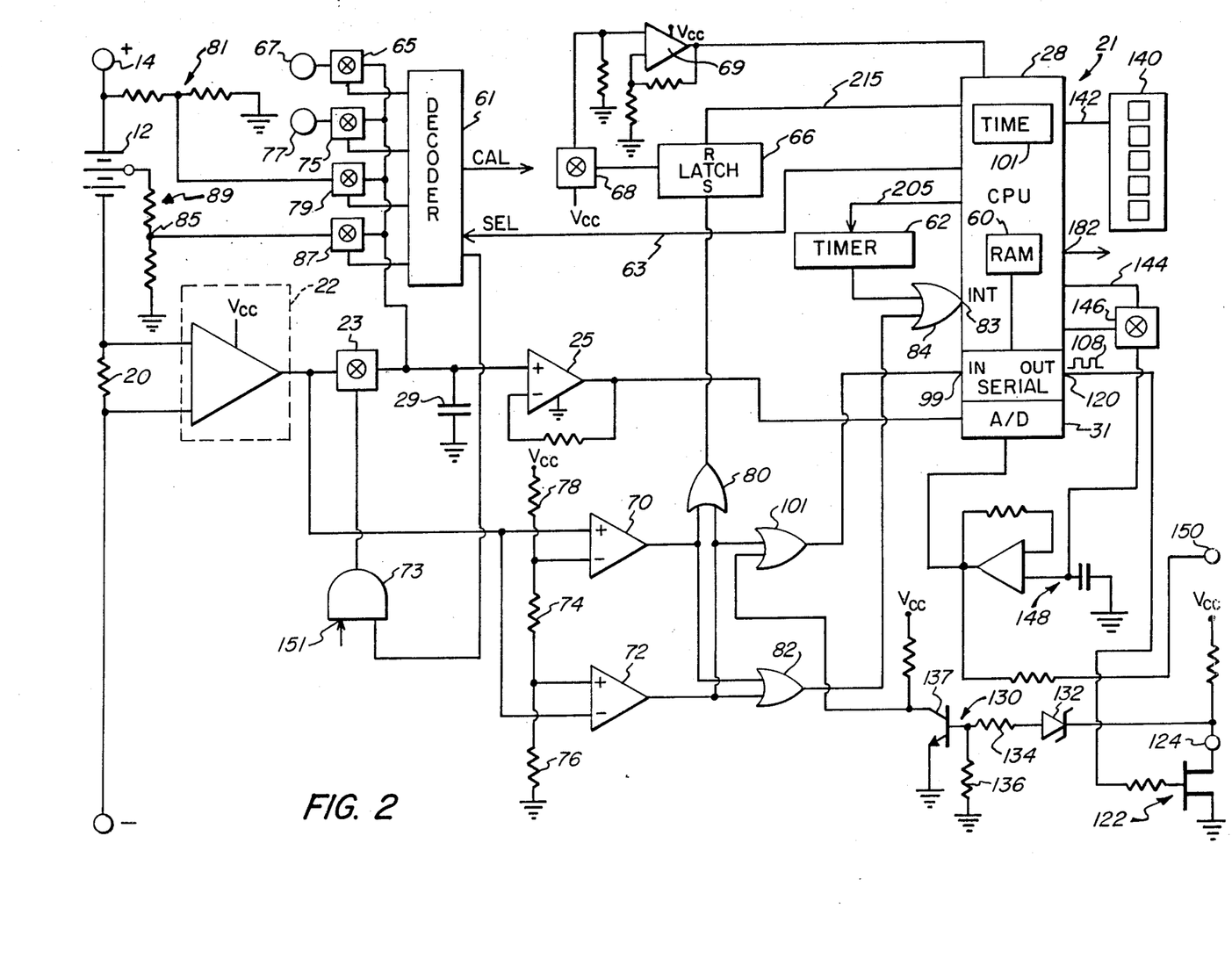
FIG. 2 is a more detailed circuit diagram of the battery pack of FIG. 1.

Battery pack 10 further includes electronic circuitry 21 illustrated in more detail in FIG. 2. A differential amplifier 22 has inputs connected across the resistor 20 to sense the instantaneous charge or discharge current. The output of the amplifier 22 is applied through a switch 23 and a buffer amplifier 25 to the input of an A/D converter 31 within a CPU 28. As described in more detail below, the CPU reads the output of the A/D converter to determine the state of charge of the battery cells based on the measured charge and discharge currents.

In order to minimize power dissipation by the electronic circuitry 21, the CPU 28 is a type which is capable of entering into a non-functional "light-sleep" mode in which power is disconnected from most of the electronic circuitry within the CPU 28 and the CPU cannot monitor battery parameters. Motorolla Model MC68HC11 is such a type. The CPU is programmed to enter into the light-sleep mode when there is neither charging nor discharging activity for a predetermined period, for example, one hour. A timer 101 within the CPU, which may comprise a register incremented with the passage of time, measures the inactive time as described in more detail below. The CPU 28 includes a non-volatile RAM 60 which stores battery parameter data indicating the amount of discharge of the battery cells 12, the number of discharge and recharging cycles, the highest temperature that either the battery cells or the battery system 10 has ever experienced, and the type and serial number of the battery. During the light-sleep, power is supplied to a timer 62 external to the CPU which periodically "wakes-up" the entire CPU to its functional mode to monitor battery parameters. By way of example, the timer 62 wakes-up the CPU every 250 milliseconds to enable the CPU to read the output of the A/D converter 31 to determine the amount of instantaneous charge or discharge current, if any. If amplifier 22 indicates battery discharge, the CPU approximates the ampere-hour discharge during the previous 250 millisecond interval. By way of example, to estimate the amount of discharge between the readings, the CPU may multiply the discharge current times 250 milliseconds. Then, the CPU calculates the remaining charge in the battery cells 12 by subtracting the amount of discharge between the readings from the battery charge calculated at the previous reading.

When awake, the CPU also monitors the temperature of the battery cells by commanding selection decoder 61 via lines 63 to activate a switch 65 coupled to temperature sensor 67 so that the signal provided by temperature sensor 67 is supplied to the input of buffer 25. Simultaneously, the CPU directs the decoder 61 to disable switch 23 via gate 73. The CPU then reads the temperature from the A/D converter. Next, the CPU activates switch 75 by appropriate commands on lines 63 to interconnect battery pack, surface temperature sensor 77 to the input of buffer 25 while simultaneously disabling switches 23 and 65. Next, the CPU enables switch 79 to interconnect the positive terminal 14 of the battery pack via a voltage divider 81 to the input of buffer 25 while disabling the other switches so that the CPU can monitor the combined voltage of the battery cells. Then, the CPU activates a switch 87 to interconnect a voltage tap 85, which sensors the voltage of half of the battery cells, to the buffer 25 via a voltage divider 89 while disabling the other switches.

During the light-sleep and functional modes of operation, power is supplied to the CPU via a switch 68 and a buffer amplifier 69. The CPU continuously repeats the foregoing cycles of light-sleep and periodic awakening until either the CPU detects charging or discharging activity, or the cell voltage drops below a predetermined level. If the voltage drops below this low level, the CPU 28 transmits a reset pulse to a latch 66 which opens the switch 68 and thereby prevents the delivery of power to the CPU 28. Consequently, the CPU enters into a "deep-sleep" mode. By way of example, during light-sleep the CPU draws approximately 20% of the power that it draws during the functional, "awake" mode, and during "deep-sleep", the CPU draws essentially no power. However, as noted above, during deep-sleep, the data is retained in the non-volatile RAM 60.

During the light-sleep and deep-sleep modes, power is still applied to the amplifier 22 and to comparators 70 and 72, which amplifier and comparators are capable of awakening the CPU from either deep-sleep or light-sleep during charging or discharging. An input of each of the comparators is connected to the output of the amplifier 22. The other, negative input of comparator 70 is provided with a threshold voltage determined by the magnitude of resistors 74 and 76 in relation to the magnitude of resistor 78. The other, positive input of comparator 72 is provided with a threshold voltage determined by the magnitude of resistor 76 in relation to the magnitudes of resistors 74 and 78.

When the battery system is connected to a load, a voltage develops across the resistor 20. The voltage is sensed by the amplifier 22 and applied to the comparator 70. If the voltage is above the threshold level, comparator 70 transmits a binary 1 set signal to the latch 66 via OR gate 80. This resumes the supply of power to CPU 28 if it was in deep-sleep. Comparator 70 also transmits a binary 1 signal to interrupt port 83 of the CPU via OR gates 82 and 84. This awakens the CPU from light-sleep if it was in light-sleep and directs the CPU to read the A/D converter and thus, the discharge current. The CPU remains in the functional, awake mode for a predetermined period in which it continuously monitors the discharge. After the predetermined period which, for example, is one hour after the cessation of discharge, the CPU returns to the light-sleep and periodic awakening mode in which timer 62 is used to awaken the CPU. One reason that both the timer 62 and the comparator 82 are used to awaken the CPU from light-sleep is that the comparator is preferably a CMOS or other low power type and may not be sensitive to small discharge currents while the amplifier 22 is sensitive and the timed awakening is useful to monitor such small discharge.

The battery charger 11 includes a source 92 of voltage and an electronic switch 94 which couples the voltage source 92 to the positive terminal 14 of the battery pack. Thus, when the battery charger delivers current to the positive terminal 14, current flows into battery cells 12 and across the resistor 20 in the direction indicated by arrow 19 as noted above. A corresponding voltage is developed across the input of amplifier 22 and comparator 72. This voltage is greater than the threshold voltage of comparator 72 so that the comparator supplies a binary 1 set pulse to latch 66 via OR gate 80 which resumes the supply of power to CPU 28 (if it was in deep-sleep) via switch 68 and buffer 69. The comparator 72 also supplies a binary 1 signal to interrupt port 83 via OR gates 82 and 84. As noted above, the signal applied to interrupt port 83 awakens the CPU from light-sleep if it was in light-sleep and directs the CPU to read the A/D converter. Comparator 72 also outputs to a serial data input port 99 via OR gate 101, and if the A/D converter indicates that the battery is receiving current in the polarity of charge, the CPU reads the serial data input port 99.

Figure 3:
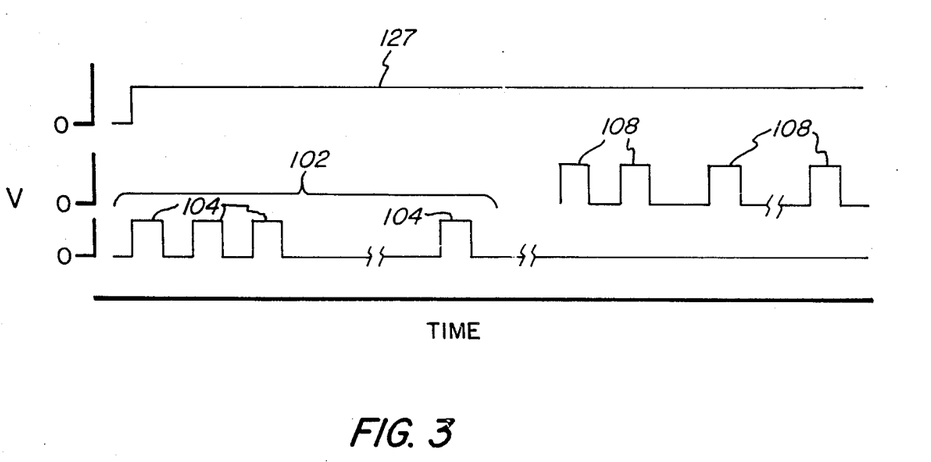
FIG. 3 is a timing diagram illustrating digital communication between the battery charger and battery pack of FIG. 1.

As illustrated in FIG. 3, when the battery pack 10 is installed in battery charger 11, the battery charger can transmit a code 102 to the CPU requesting specific battery parameter data by delivering current pulses 104 into the positive terminal 14. The current pulses cause voltage pulses to develop across the resistor 20 and at the outputs of amplifier 22 and comparator 72. These voltage pulses, as noted above, are supplied to the serial data input port 99 of the CPU. Thus, CPU 28 is awakened by the onset of the first pulse 104 of code 102 by setting of latch 66 (if necessary) and activation of interrupt port 80, and alerted to read the subsequent data. By way of example, the code 102 includes a start bit, a stop bit, and 8 intervening data bits specifying the requested battery parameter data. Code 102 instructs the CPU to transmit battery parameter data to the logic and microprocessor (MP) circuitry 96 within battery charger 11. This data is the data contained within the non-volatile RAM 60 and, as noted above, includes the amount of discharge of the battery, the battery capacity, the number of charging/recharging cycles, the highest battery cell or surface temperature that the battery has experienced, the type of battery, and the serial number of the battery. The CPU transmits the requested information by outputting serial data pulses 108 from output port 120 and through FET buffer 122 and battery pack port 124. The data is received by the charger at input port 126. Then the battery charger 11 may request additional information by transmitting the respective code into the positive terminal 14.

The CPU is also programmed to transmit all of its battery parameter data to output port 124 in a predetermined order after the onset of receipt of charge current 127 if no specific data request current is received.

After the battery charger receives all the data it requires, it charges the battery cells 12 by delivering charging current to the positive terminal 14 in accordance with the state of charge of the battery cell 12, the type of battery, and the temperatures of the cells and battery pack surface. For example, if the battery is substantially discharged and within a safe charging temperature range, charger 11 supplies a maximum charging current. However, if the battery is nearly fully charged or above the temperature range, then charger 11 supplies a lesser current. Charging techniques suitable for the battery pack 10 and battery charger 11 are described in commonly assigned U.S. patent application Ser. No. 115,155 entitled "Battery Charging System" filed Oct. 30, 1987 by George W. Bauer et al, and U.S. Pat. No. 4,554,500 to Sokira issued Nov. 19, 1985, which patent application and patent are hereby incorporated by reference as part of the present disclosure.

It should be appreciated that the positive terminal 14 serves to route operating current from the battery cells to an actual load, route data from battery charger 11 to the CPU, and route charging current from the battery charger to the battery cells.

During charging of the battery pack 10, the CPU is continuously awake and functional to accurately monitor the charging current.

Electronic circuitry 21 further includes a communication link 130 comprising a zener diode 132, input resistors 134 and 136 and transistor 137 which link receives data at port 124 and transmits it to the serial data input port 99 of the CPU via OR gate 101. This communication link may be used at the factory or during service to transmit a code to the CPU to elicit data via FET 122. However, battery charger 11 and other types of battery chargers may not be equipped to transmit data to the CPU via port 124 and communication link 130 so that transmission of a data request into terminal 14 either by a specific data code or by the onset of charging current is important.

The battery pack 10 further includes an LCD bar graph 140 which receives information from the CPU via lines 142 indicating the amount of charge remaining in the battery, and displays this information. The CPU also outputs via line 144, an analog signal, representing the remaining charge in the battery, through a switch 146 to a sample and hold circuit 148. The analog output is provided on port 150 of the battery pack to supply an optional meter within a video camera or other appliance. The output of the sample and hold circuit 148 is also fed back to the A/D converter for calibration purposes.

Figure 5A:
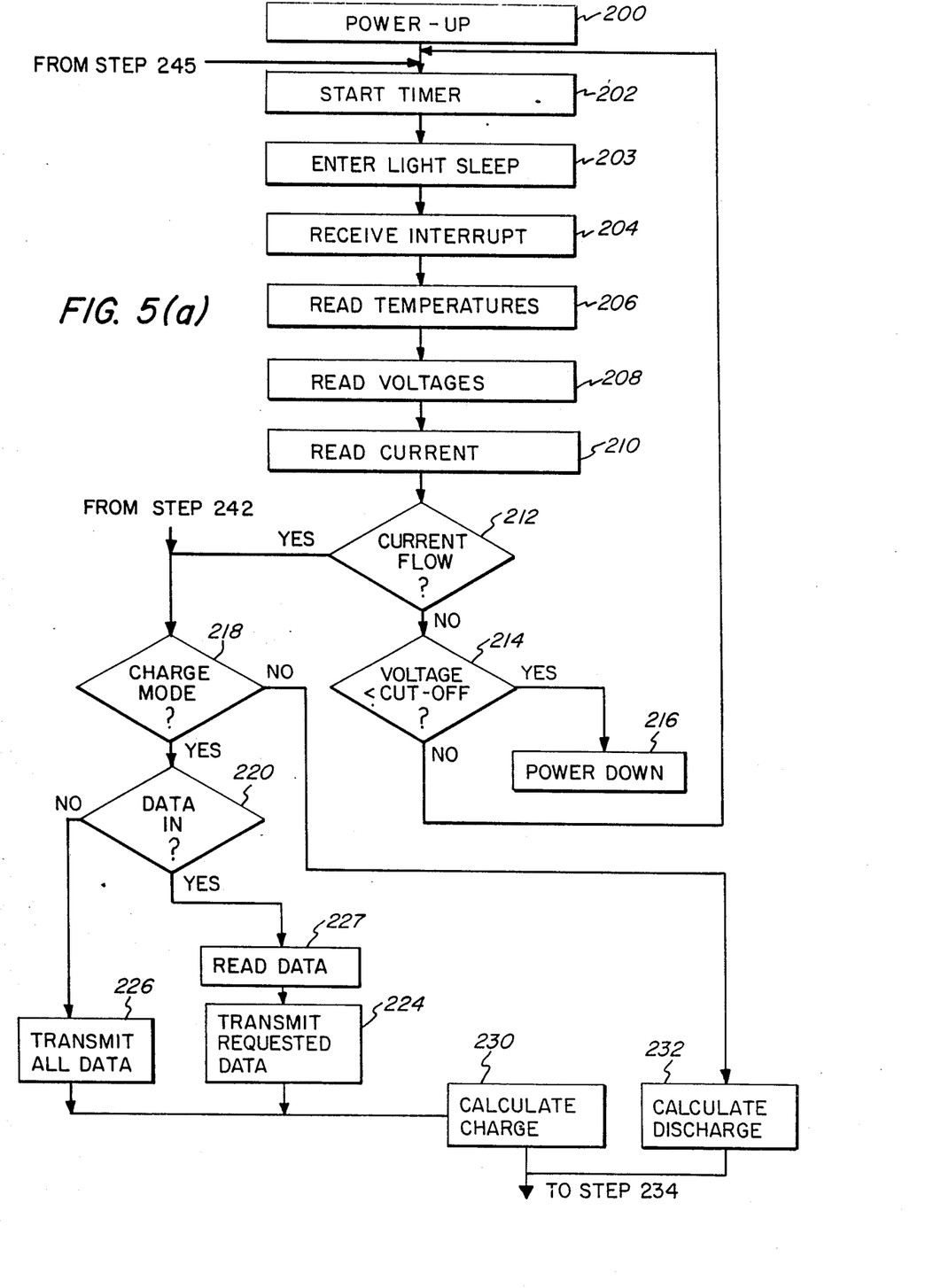
FIG. 5 (comprising FIGS. 5(a) and 5(b)) is a flow chart illustrating operation of a microprocessor and the other electronic circuitry of FIG. 2.
Figure 5B:
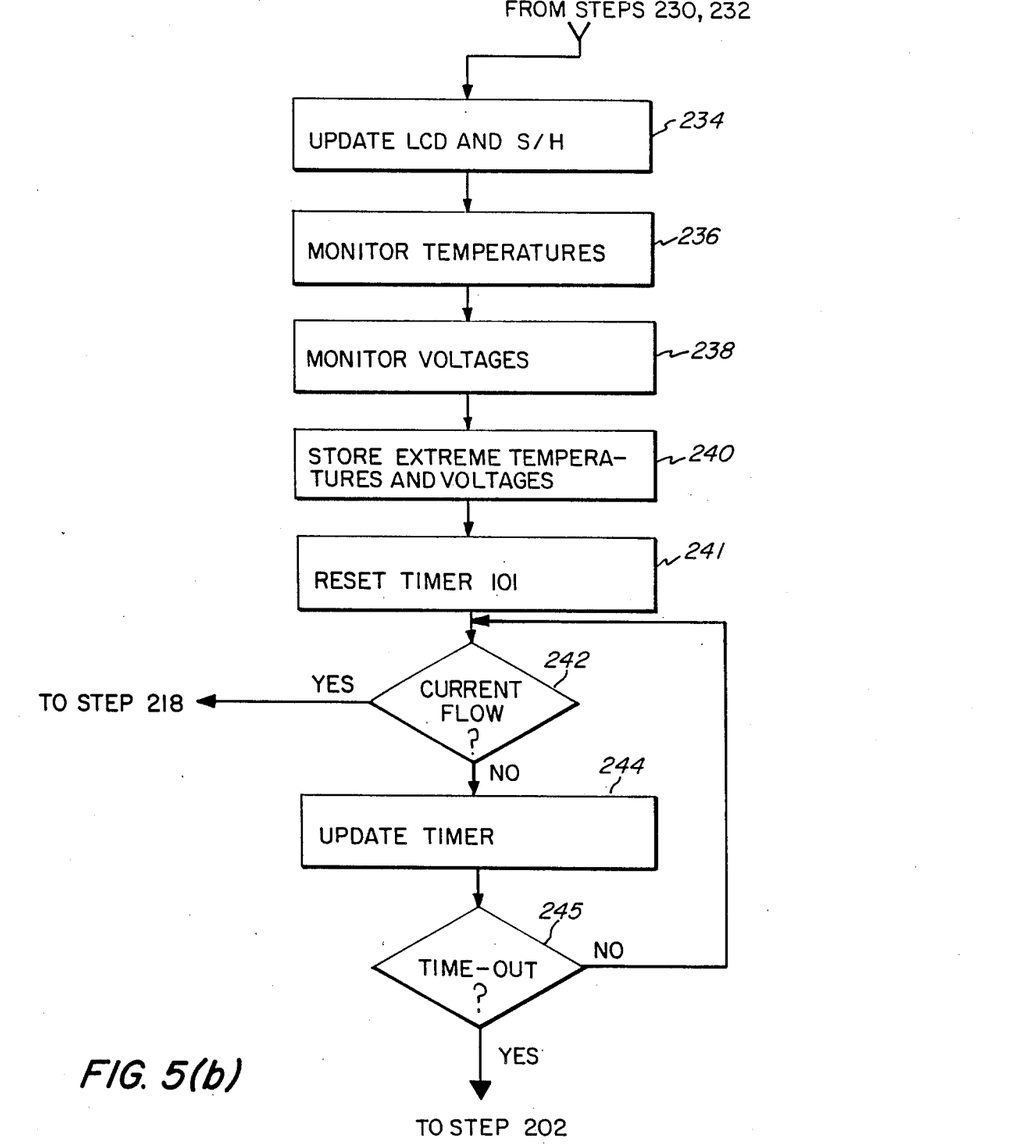

FIGS. 5(a) and 5(b) form a flow chart illustrating the operation of the CPU and associated circuitry. To begin the operation, the system is powered-up by the application of power to the CPU (step 200) by setting of latch 66 as noted above. Then, the CPU starts the timer 62 (step 202) by transmitting a pulse on line 205 and enters into the non-functional, light-sleep mode (step 203). Next, a pulse is applied to interrupt port 83 either by the timer, comparator 70 or comparator 72 (step 204). As noted above, comparator 70 transmits such a pulse to interrupt port 83 upon discharge of the battery and comparator 72 transmits such a pulse to interrupt port 83 upon charge of the battery. After any of the three events, the CPU awakens from the light or deep-sleep, reads the temperature sensors 67 and 77, the full battery voltage, and the half battery voltage to determine if the battery is within safe operating limits (steps 206 and 208). Next, the CPU reads the charge or discharge current by reading A/D converter 31 (step 210). If no current is flowing at the time, the CPU determines whether the overall battery voltage is less than the low, cut-off level which represents the specified usable limit of the battery pack (step 214). If the battery voltage is below this level, the CPU transmits a reset pulse on line 215 to latch 66 to power-down the CPU. If not, the CPU loops back to step 202 to start the timer again.

Returning to step 212, if current was flowing at the time, the CPU determines whether the current is in the charge or discharge mode (step 218) by reading the output of the A/D converter. If in the charge mode, the CPU proceeds to step 220 in which it determines whether data is being transmitted into terminal 14. If so, the CPU reads the data (step 227) and in response, transmits the requested information via output port 124 (step 224). If, on the other hand, the charging current was simply charging current and did not contain variable data, the CPU proceeds from step 220 to step 226 in which it transmits all relevant data in a predetermined order to output port 124. After the transmission of data in either step 224 or step 226, the CPU calculates the amount of charge of the battery pack (step 230).

Returning again to step 218, if amplifier 22 indicates that the battery is being discharged instead of charged, step 218 leads to step 232 in which the CPU calculates the amount of discharge of the battery cells (step 232).

After either of steps 230 or 232, the CPU updates the LCD display 140 and the sample and hold circuit 148 with the current state of charge of the battery (step 234).

Next, the CPU again monitors the temperature sensors 67 and 77 and the full battery voltage and half battery voltage (steps 236 and 238). The CPU also stores data indicating the extreme temperatures and voltages to which the battery pack has been exposed (step 240). Then, the CPU resets the timer 101 (step 241).

Next, the CPU reads the output of A/D converter 31 to determine if there is additional current flowing through the battery cells (step 242), and if so, loops back to the step 218 to monitor the charger or discharge as the case may be. If not, the CPU loops from step 242 to a step 244 in which it updates the timer 101. Until the timer times out as noted in step 245, step 245 leads back to step 242 in which the CPU reads the output of A/D converter 31 to determine if current is flowing. Thus, if no current flows for the duration of the timer, for example, one hour, then step 245 leads back to step 202 in which the CPU starts timer 62 and enters again into the light-sleep mode. As noted above, this conserves power because most of the power to the CPU is turned off until the interrupt pulse is generated at interrupt port 83 in step 204. This begins another iteration of the flow chart.

Figure 4:
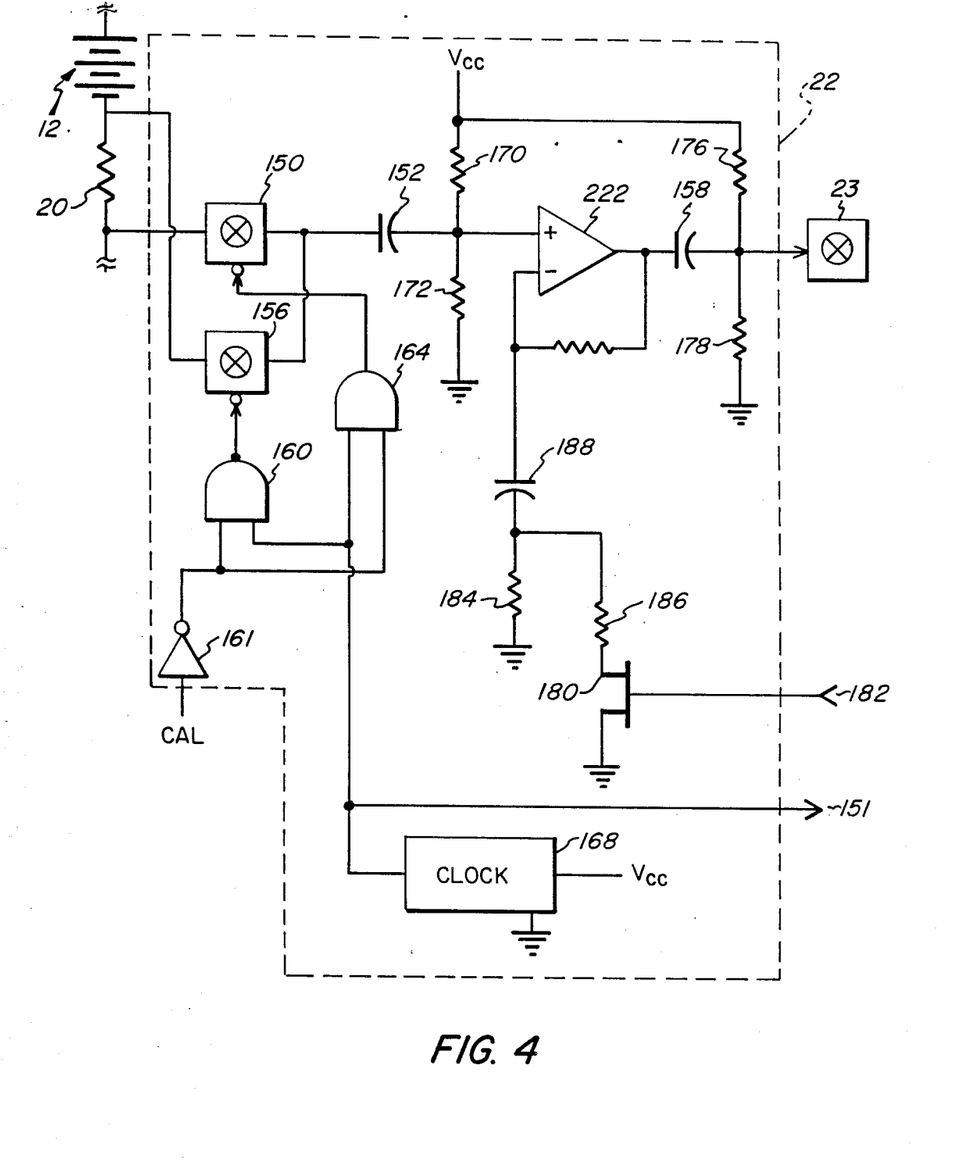
FIG. 4 is a schematic circuit diagram of an amplifier within the battery pack.

FIG. 4 illustrates one type of design for the amplifier 22. According to this design, the amplifier is a switching type and includes associated circuitry as follows. One side of resistor 20 is connected to a positive input of an amplifier 222 via a switch 150 and a series capacitor 152. The other side of resistor 20 is connected to the same input of amplifier 122 via a switch 156 and the capacitor 152. The output of amplifier 222 is supplied through another series capacitor 158 to the switch 23 en route to buffer 25 and the A/D converter of the CPU. To calibrate the amplifier 222, the CPU directs the selection decoder 61 to transmit a binary 1 calibrate pulse ("CAL") to the input of inverter gate 161 and a binary 1 pulse to AND gate 73. Consequently, a binary zero pulse is sent to the inputs of NAND gate 160 and AND gate 164, and switch 156 is opened and switch 150 is closed. A square wave clock 168 supplies the other inputs of NAND gate 160, AND gate 164, and an input 151 of AND gate 73. Consequently, a reference voltage of the battery pack is supplied through switch 150 to a first side of capacitor 152. The other side of capacitor 152 is connected between resistors 170 and 172 which are identical to each other. The resistor 172 is connected to $V_{cc}$ so that a zero current reference voltage of $V_{cc}/2$ is supplied to the positive input of amplifier 222. Resistors 176 and 178 are identical to the resistors 170 and 172 and similarly center the output voltage provided by amplifier 222 through capacitor 158. Resistors 170, 172, 176 and 178 are provided to center the zero current so that the A/D converter can indicate both positive and negative voltages associated with charging and discharging current. Then, when the clock outputs a positive pulse to input 151 of gate 73, switch 23 supplies the reference voltage to A/D converter 36 via buffer 25. The CPU reads and stores the reference voltage.

It should also be noted that amplifier 222 is capable of two voltage gain ranges. When a transistor 180 is deactivated by a binary zero signal from port 182 of the CPU, the amplifier provides relatively low gain because a resistor 184 receives all the feed back current. However, when a binary 1 signal is supplied from port 182, the amplifier provides the relatively high gain because resistor 184 is in parallel with a resistor 186. Capacitor 188 ensures that amplifier 22 amplifies only AC signals. The CPU selects the gain to best utilize the range of the amplifier and A/D converter.

Next, the CPU directs the selection decoder 61 to deliver a binary 1 signal to NAND gate 160 and AND gate 164 by transmitting a binary zero pulse to inverter gate 161 so that the voltages at each end of resistor 20 are sequentially supplied to the first side of capacitor 152 and the resultant, centered voltages are applied to the positive input of amplifier 222. The output of amplifier 222 is smoothed by a capacitor 29 (FIG. 2) and indicates the voltage across resistor 20 due to either charge or discharge of the battery cells. The voltage is read by the CPU at the output of the A/D converter.

By the foregoing, a battery charging system comprising a battery pack and an associated battery charger embodying the present invention has been disclosed. However, numerous modifications and substitutions may be made without deviating from the scope of the invention. For example, if desired, a non-switching amplifier may be utilized for amplifier 22. Therefore, the invention has been disclosed by way of illustration and not limitation, and reference should be made to the following claims to determine the scope of the invention.

We claim:

1. A battery system comprising a battery pack, said battery pack including:
    a plurality of battery cells;
    positive and negative terminals serially coupled to said battery cells, said positive terminal delivering output current to a load and receiving input current in the direction of charging current;
    sensing means for sensing current and data pulses flowing through said battery cells and said positive and negative terminals;
    an output port outputting data from said battery pack;
    memory means for storing battery parameter data; and
    electronic means, coupled to the sensing means and said memory means, for transmitting said battery parameter data to said output port in response to said sensing means sensing said current input through said positive terminal in the direction of charging current.

2. A battery system as set forth in claim 1 wherein said output port of said battery pack is separate from said positive and negative terminals.

3. A battery system as set forth in claim 1 wherein the sensing means comprises a resistor in series with said positive and negative terminals and said battery cells, and an amplifier coupled across the series resistor to measure the voltage across said series resistor, the output of said amplifier being provided to said electronic means.

4. A battery system as set forth in claim 3 wherein:
    said sensing means further comprises a comparator having a first input connected to the output of said amplifier, a second input connected to a source of threshold voltage, and an output connected to said electronic means, whereby said electronic means receives a binary signal corresponding to the level of said input current; and
    said electronic means includes means for reading said binary signal.

5. A battery system as set forth in claim 1 wherein said electronic means responds to the sensing means sensing data pulses input through said positive terminal in the direction of charging current, and transmits specific battery parameter data over said output port in response to said data pulses.

6. A battery system as set forth in claim 2 wherein said data pulses initiate transmission of battery parameter data by the electronic means describing the state of charge of said battery cells.

7. A battery system as set forth in claim 5 further comprising:
    a battery charger, said battery charger including means releasably coupled to said positive and negative terminals of said battery pack for delivering substantial charging current and the data pulses to said positive terminal and battery cells.

8. A battery system as set forth in claim 7 wherein said battery charger further comprises means coupled to said output port of said battery pack for reading and processing said battery parameter data, and controlling the means for delivering substantial charging current in accordance with said battery parameter data.

9. A battery pack comprising:
a plurality of battery cells having a state of charge;
sensing means for sensing current flowing through said battery cells;
processor means coupled to the sensing means, said processor means powered by said battery cells and functional in a relatively high power consumption mode to determine the state of charge of said battery cells based on the amount of current flowing through said battery cells;
first means for rendering said processor means into the functional, relatively high power consumption mode at times when the battery is being charged or discharged to monitor the amount of current flow and determine the state of charge of said battery cells; and
second means for automatically rendering said processor means into a non-functional relatively low power current consumption mode at other times to conserve power;
wherein said flow of current is due to discharge of said battery cells, and said processor means determines the state of charge based at least in part on the amount of ampere-hours of the discharge current.

10. A battery pack comprising:
a plurality of battery cells having a state of charge;
sensing means for sensing current flowing through said battery cells;
processor means coupled to the sensing means, said processor means powered by said battery cells and functional in a relatively high power consumption mode to determine the state of charge of said battery cells based on the amount of current flowing through said battery cells;
first means for rendering said processor means into the functional, relatively high power consumption mode at times when the battery is being charged or discharged to monitor the amount of current flow and determine the state of charge of said battery cells; and
second means for automatically rendering said processor means into a non-functional relatively low power current consumption mode at other times to conserve power;
wherein said flow of current is due to charging of said battery cells, and said processor means determines the state of charge based at least in part on the amount of ampere-hours of the charge current.

11. A battery pack comprising:
a plurality of battery cells having a state of charge;
sensing means for sensing current flowing through said battery cells;
processor means coupled to the sensing means, said processor means powered by said battery cells and functional in a relatively high power consumption mode to determine the state of charge of said battery cells based on the amount of current flowing through said battery cells;
first means for rendering said processor means into the functional, relatively high power consumption mode at times when the battery is being charged or discharged to monitor the amount of current flow and determine the state of charge of said battery cells; and
second means for automatically rendering said processor means into a non-functional relatively low power current consumption mode at other times to conserve power;
wherein said second rendering means renders said processor means into said relatively low power consumption mode when said current does not flow through said battery pack for a predetermined period.

12. A battery pack comprising:
a plurality of battery cells having a state of charge;
sensing means for sensing current flowing through said battery cells;
processor means coupled to the sensing means, said processor means powered by said battery cells and functional in a relatively high power consumption mode to determine the state of charge of said battery cells based on the amount of current flowing through said battery cells;
first means for rendering said processor means into the functional, relatively high power consumption mode at times when the battery is being charged or discharged to monitor the amount of current flow and determine the state of charge of said battery cells; and
second means for automatically rendering said processor means into a non-functional relatively low power current consumption mode at other times to conserve power;
wherein the first rendering means comprises a timer which periodically renders said processor means functional.

13. A battery pack comprising:
a plurality of battery cells having a state of charge;
sensing means for sensing current flowing through said battery cells;
processor means coupled to the sensing means, said processor means powered by said battery cells and functional in a relatively high power consumption mode to determine the state of charge of said battery cells based on the amount of current flowing through said battery cells;
first means for rendering said processor means into the functional, relatively high power consumption mode at times when the battery is being charged or discharged to monitor the amount of current flow and determine the state of charge of said battery cells; and
second means for automatically rendering said processor means into a non-functional relatively low power current consumption mode at other times to conserve power;
further comprising third means for rendering said microprocessor means into a still lower power consumption mode when the voltage of said battery cells falls below a predetermined level.

14. A battery pack comprising:
a plurality of battery cells having a state of charge;
sensing means for sensing current flowing through said battery cells;
processor means coupled to the sensing means, said processor means powered by said battery cells and functional in a relatively high power consumption mode to determine the state of charge of said battery cells based on the amount of current flowing through said battery cells;

first means for rendering said processor means into the functional, relatively high power consumption mode at times when the battery is being charged or discharged to monitor the amount of current flow and determine the state of charge of said battery cells; and second means for automatically rendering said processor means into a non-functional relatively low power current consumption mode at other times to conserve power;

wherein said second rendering means comprises a timer.

15. A battery pack comprising:

a plurality of battery cells having a state of charge;

sensing means for sensing current flowing through said battery cells;

processor means coupled to the sensing means, said processor means powered by said battery cells and functional in a relatively high power consumption mode to determine the state of charge of said battery cells based on the amount of current flowing through said battery cells;

first means for rendering said processor means into the functional, relatively high power consumption mode at times when the battery is being charged or discharged to monitor the amount of current flow and determine the state of charge of said battery cells; and second means for automatically rendering said processor means into a non-functional relatively low power current consumption mode at other times to conserve power;

wherein said processor means when functional also monitors battery temperature.

16. In a battery system comprising a battery pack and a battery charger, said battery pack including a battery and electronic circuitry monitoring battery parameters, a method of minimizing power dissipation by the electronic circuitry, comprising:

providing a battery pack including a battery and electronic circuitry, said battery having an instantaneous state of charge or discharge;

connecting a battery charger to the battery pack for providing a charging current to the battery;

connecting, in the battery pack, a resistor in series with the battery for developing a voltage drop across the resistor indicative of charge current flowing into or discharge current flowing out of the battery;

causing a first portion of the electronic circuitry to enter into a "light-sleep" mode when there is neither charging nor discharging activity sensed for a predetermined period of time;

providing non-volatile memory for storing battery parameter data sensed or calculated by the first portion of the electronic circuitry;

during the light-sleep mode of the first portion of the electronic circuitry, supplying power to a timer in a second portion of the electronic circuitry, said timer periodically "waking-up" the first portion of the electronic circuitry;

in the first portion of the electronic circuitry, sensing the instantaneous state of charge or discharge upon waking-up, reading and calculating other battery parameter data during the wake-up period, storing said battery parameter data in the non-volatile memory, and then re-entering the light-sleep mode in preparation for the next periodic wake-up by the timer; and continuously repeating the cycles of light-sleep and periodic waking-up until either charging or discharging activity above a threshold is detected or the battery voltage drops below a predetermined level, at which time the first portion of the electronic circuitry enters a fully functional mode;

further comprising:

providing an output port in the battery pack; and transmitting the stored battery parameter data out of the output port to the charger in response to sensed charge current;

wherein the battery includes a series of cells, and further comprising:

sensing the voltage across a fractional portion of the battery cells.

17. In a battery system comprising a battery pack and a battery charger, said battery pack including a battery and electronic circuitry monitoring battery parameters, a method of minimizing power dissipation by the electronic circuitry, comprising:

providing a battery pack including a battery and electronic circuitry, said battery having an instantaneous state of charge or discharge;

connecting a battery charger to the battery pack for providing a charging current to the battery;

connecting, in the battery pack, a resistor in series with the battery for developing a voltage drop across the resistor indicative of charge current flowing into or discharge current flowing out of the battery;

causing a first portion of the electronic circuitry to enter into a "light-sleep" mode when there is neither charging nor discharging activity sensed for a predetermined period of time;

providing non-volatile memory for storing battery parameter data sensed or calculated by the first portion of the electronic circuitry;

during the light-sleep mode of the first portion of the electronic circuitry, supplying power to a timer in a second portion of the electronic circuitry, said timer periodically "waking-up" the first portion of the electronic circuitry;

in the first portion of the electronic circuitry, sensing the instantaneous state of charge or discharge upon waking-up, reading and calculating other battery parameter data during the wake-up period, storing said battery parameter data in the non-volatile memory, and then re-entering the light-sleep mode in preparation for the next periodic wake-up by the timer; and continuously repeating the cycles of light-sleep and periodic waking-up until either charging or discharging activity above a threshold is detected or the battery voltage drops below a predetermined level, at which time the first portion of the electronic circuitry enters a fully functional mode;

further comprising:

providing an output port in the battery pack; and transmitting the stored battery parameter data out of the output port to the charger in response to sensed charge current;

further comprising:

transmitting a coded signal, in the form of current pulses, from the battery charger to the battery pack, via at least one of the battery terminals used for providing charging current to the battery.

18. A method according to claim 17, wherein the coded signal is used to request specific battery parameter data from the electronic circuitry.

* * * * *